United States Patent
Rothaar et al.

(10) Patent No.: US 8,634,024 B2
(45) Date of Patent: Jan. 21, 2014

(54) ASYNCHRONOUS SCANNING DISPLAY PROJECTION

(75) Inventors: Bruce C. Rothaar, Woodinville, WA (US); Mark Champion, Kenmore, WA (US)

(73) Assignee: Microvision, Inc., Redmond, WA (US)

( * ) Notice: Subject to any disclaimer, the term of this patent is extended or adjusted under 35 U.S.C. 154(b) by 580 days.

(21) Appl. No.: 12/484,655

(22) Filed: Jun. 15, 2009

(65) Prior Publication Data

US 2010/0315552 A1  Dec. 16, 2010

(51) Int. Cl.
H04N 5/04 (2006.01)
(52) U.S. Cl.
USPC ........... 348/500; 348/512; 348/745; 348/203; 348/61
(58) Field of Classification Search
USPC .............................. 348/500, 512, 745, 203, 61
See application file for complete search history.

(56) References Cited

U.S. PATENT DOCUMENTS

| 7,619,644 | B2* | 11/2009 | Johnston | 347/237 |
| 2002/0158814 | A1* | 10/2002 | Bright et al. | 345/7 |
| 2008/0001850 | A1* | 1/2008 | Champion et al. | 345/7 |
| 2009/0174788 | A1* | 7/2009 | Ise | 348/222.1 |

FOREIGN PATENT DOCUMENTS

| EP | 0615383 | 9/1994 |
| JP | 02-029170 | 1/1990 |

OTHER PUBLICATIONS

"PCT Search Report and Written Opinion", *PCT Search Report and Written Opinion* Dec. 31, 2010.

* cited by examiner

*Primary Examiner* — Jivka Rabovivanski
(74) *Attorney, Agent, or Firm* — Kevin D. Wills

(57) ABSTRACT

A scanning projector includes a mirror that scans in two dimensions, at least one of which is sinusoidal. A digital phase lock loop locks to the sinusoidal movement of the mirror. A free-running pixel clock is provided. An interpolation component interpolates pixel intensity data from adjacent pixels based on the position of the mirror when a pixel clock arrives.

20 Claims, 12 Drawing Sheets

ASYNCHRONOUS SCANNING DISPLAY PROJECTION

FIELD

The present invention relates generally to display devices, and more specifically to scanning display devices.

BACKGROUND

Some display devices create an image by scanning a beam of varying intensity across a display surface. For example, in cathode ray tubes (CRTs), an electron beam is scanned across a surface in a row and column pattern. Further, some projection display devices scan a light beam across a surface in a row and column pattern. In these display devices, the beam intersects each pixel location as it paints the image row by row. The intensity of the scanned light beam is then modulated as it passes over each display pixel location.

Pixels are typically displayed at times specified by a "pixel clock". The pixel clock is typically generated by phase locking the output of a voltage controlled oscillator (VCO) to a sync signal that describes the position of the scanned beam. VCOs used for this purpose are typically sensitive analog circuits that are susceptible to electromagnetic interference (EMI).

DESCRIPTION OF EMBODIMENTS

Figure 1:
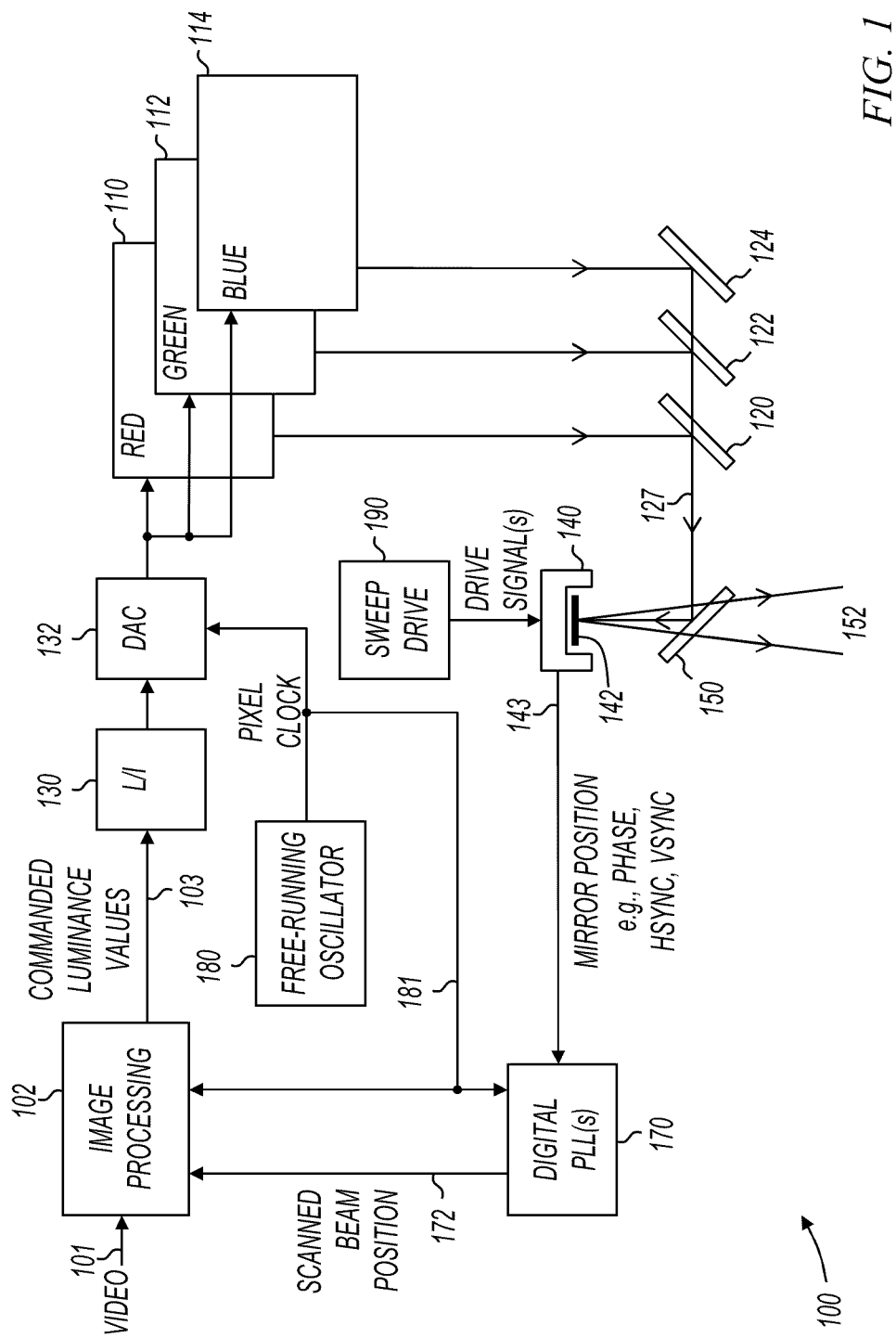
FIG. 1 shows a projection system with an asynchronous pixel clock.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a projection system with an asynchronous pixel clock. Projection system 100 includes image processing component 102, luminance-to-current (L/I) translator 130, digital-to-analog converter (DAC) 132, and laser light sources 110, 112, and 114. Projection system 100 also includes beam combiners 120, 122, and 124, filter/polarizer 150, microelectromechanical machine (MEMS) device 140 having mirror 142, digital phase lock loop(s) (PLL) 170, and free-running oscillator 180.

In operation, image processing component 102 receives video data on node 101, receives a pixel clock from free-running oscillator 180, and produces commanded luminance values at 103 to drive the laser light sources when pixels are to be displayed. The commanded luminance values are converted to digital current values by L/I translator 130, and the digital current values are converted to analog currents by DAC 132. The analog currents are produced at times specified by the pixel clock. For example, when the pixel clock produces an edge, DAC 132 may produce a current to drive the laser light sources which in turn produce a light beam. System 100 may include multiple L/I translators and DACs. For example, separate L/I translators and DACs may be provided for each color (red, green, blue).

Red, green, and blue light is provided by the laser light sources 110, 112, and 114, although other light sources, such as color filters or light emitting diodes (LEDs) or edge-emitting LEDs, could easily be substituted. One advantage of lasers is that their light is produced as a column, and this column emerges as a narrow beam. The laser light is combined by beam combiners 120, 122, and 124. In some embodiments, beam combiners 120, 122, and 124 are dichroic mirrors, although other beam combining elements may be substituted without departing from the scope of the present invention. The resulting color light beam is directed at the MEMS mirror 142.

The MEMS mirror 142 rotates on two axes in response to electrical stimuli shown as "DRIVE SIGNAL(s)" provided by sweep drive 190. In operation, sweep drive 190 provides signals to MEMS device 140 to cause a beam to scan a trajectory to paint a display image. The beam scan trajectory may take any form. For example, the scan trajectory may be linear while sweeping across the field of view in one direction and non-linear while sweeping across the field of view in another direction. Various embodiments further described below have a linear trajectory in the vertical direction and a non-linear trajectory in the horizontal direction. Other embodiments further described below have non-linear trajectories in both vertical and horizontal directions.

MEMS device 140 includes one or more position sensors to sense the position of mirror 142. For example, in some embodiments, MEMS device 140 includes a piezoresistive sensor that delivers a voltage that is proportional to the deflection of the mirror on the horizontal axis. Further, in some embodiments, MEMS device 140 includes an additional piezoresistive sensor that delivers a voltage that is proportional to the deflection of the mirror on the vertical axis. In other embodiments, the position information at 143 may be in the form of one or more digital sync signals. The digital sync signal may be produced directly by a position sensor or may be produced from a sinusoidal position signal.

The position information is provided to digital PLL(s) 170 at 143. PLL(s) 170 includes at least one loop circuit to track the horizontal position of mirror 142. In some embodiments, PLL(s) 170 includes a second loop circuit to track the vertical position of mirror 142.

Digital PLL(s) 170 receive the mirror position signal(s) at 143 and the free-running pixel clock at 181, and produce scanned beam position information at 172. In some embodiments, the scanned beam position information at 172 is a digital phase signal that is locked to the position of mirror 142 as it moves sinusoidally. For example, the scanned beam position information at 172 may be a substantially linearly increasing phase value that represents the current position of the mirror. In other embodiments, the scanned beam position information at 172 is a digital representation of a sine wave that corresponds to sinusoidal deflection of mirror 142. For example, the scanned beam position information at 172 may represent the sine of a phase angle that is locked to the position of the mirror. As explained further below, mirror 142 may have a sinusoidal deflection in one or both directions (e.g., only horizontal or both horizontal and vertical). The digital circuitry within digital PLL(s) 170 is clocked by the free-running pixel clock. Digital PLL(s) 170 does not generate the pixel clock.

Free-running oscillator 180 is referred to as "free-running" because it is not phase locked to the movement of scanning mirror 142. In some embodiments, free-running oscillator 180 is a crystal oscillator. If the free-running oscillator frequency drifts, then the PLL will see this as an error signal and track it just as if it were frequency drift of the mirror movement. In some embodiments, free-running oscillator 180 may include one or more control systems to increase stability (e.g., frequency stability over temp, etc), although this is not a requirement of the present invention. In other embodiments, free-running oscillator 180 produces a spread spectrum clock that reduces single frequency EMI generated by the system. In still further embodiments, free-running oscillator 180 does not include a crystal oscillator, and/or includes frequency divider circuitry or other clock generation mechanisms.

Image processing component 102 receives the scanned beam position at 172 and the free-running pixel clock at 181. Image processing component 102 uses the scanned beam position to determine which pixels are to be displayed at each edge of the free-running pixel clock. In some embodiments, image processing component 102 interpolates between neighboring pixel data to determine the commanded luminance values.

In some embodiments, approximations are made as to one or both of the horizontal and vertical scan positions. For example, in some embodiments, the vertical scan position may be approximated as a constant row, even though this may not be 100% accurate. Also for example, in some embodiments, the vertical scan position may be approximated as a closest row, even though this may not be 100% accurate. These and other approximations are described below with reference to later figures.

The various components shown in FIG. 1 may be implemented in many ways. For example, image processing component 102 may be implemented in dedicated hardware, software or any combination. When operating at slower speeds, software implementations may be fast enough to satisfy display rate requirements. When operating at high speeds, a dedicated hardware implementation may be required to satisfy display rate requirements.

Figure 2:
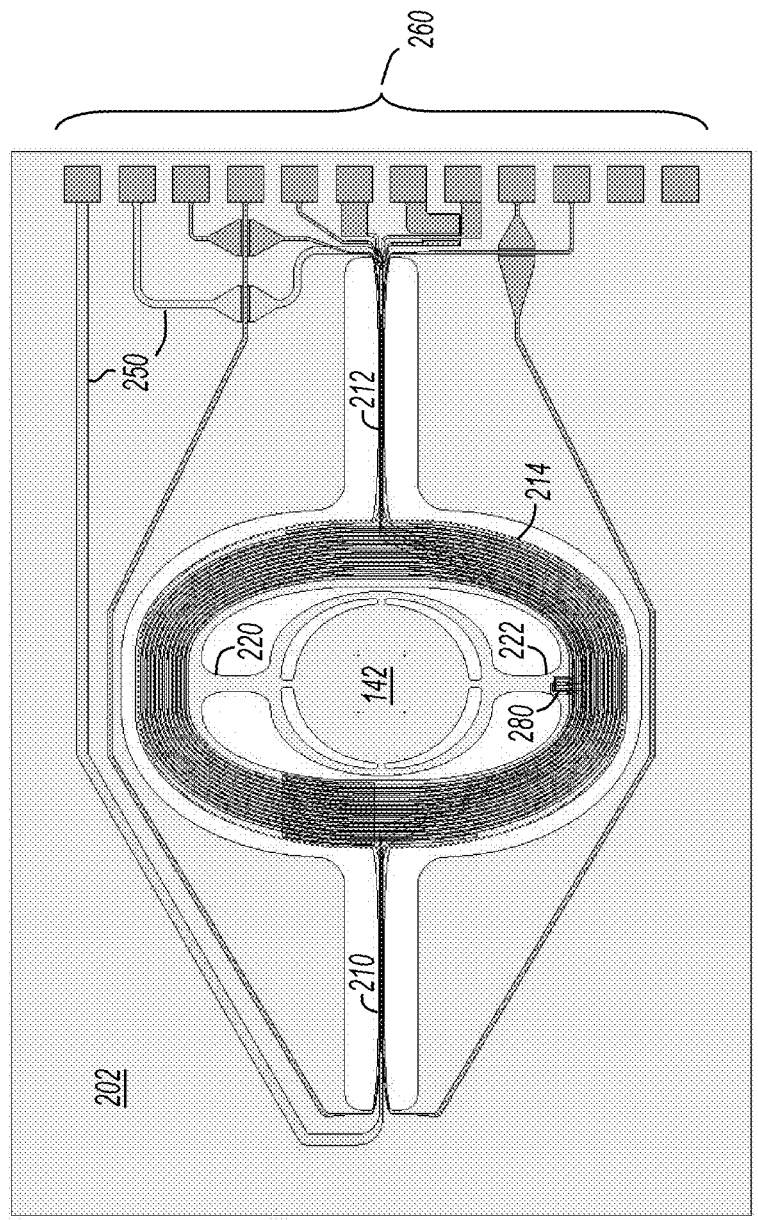
FIG. 2 shows a plan view of a microelectromechanical system (MEMS) device with a scanning mirror.

FIG. 2 shows a plan view of a microelectromechanical system (MEMS) device with a scanning mirror. MEMS device 140 includes fixed platform 202, scanning platform 214 and scanning mirror 142. Scanning platform 214 is coupled to fixed platform 202 by flexures 210 and 212, and scanning mirror 142 is coupled to scanning platform 214 by flexures 220 and 222. Scanning platform 214 has a drive coil connected to drive lines 250. Current driven into drive lines 250 produces a current in the drive coil. MEMS device 140 also incorporates one or more integrated piezoresistive position sensors. Piezoresistive sensors 280 produce a voltage that represents the displacement of mirror 142 with respect to scanning platform 214. In some embodiments, MEMS device 140 includes one position sensor for each axis. Two of the interconnects 260 are coupled to drive lines 250. The remaining interconnects provide for the integrated position sensors for each axis.

In operation, an external magnetic field source (not shown) imposes a magnetic field on the drive coil. The magnetic field imposed on the drive coil by the external magnetic field source has a component in the plane of the coil, and is oriented non-orthogonally with respect to the two drive axes. The in-plane current in the coil windings interacts with the in-plane magnetic field to produce out-of-plane Lorentz forces on the conductors. Since the drive current forms a loop on scanning platform 214, the current reverses sign across the scan axes. This means the Lorentz forces also reverse sign across the scan axes, resulting in a torque in the plane of and normal to the magnetic field. This combined torque produces responses in the two scan directions depending on the frequency content of the torque.

Scanning platform 214 moves relative to fixed platform 202 in response to the torque. Flexures 210 and 220 are torsional members that twist as scanning platform 214 undergoes an angular displacement with respect to fixed platform 202. In some embodiments, scanning mirror 142 moves relative to scanning platform 214 at a resonant frequency, although this is not a limitation of the present invention.

The long axis of flexures 210 and 212 form a pivot axis. Flexures 210 and 212 are flexible members that undergo a torsional flexure, thereby allowing scanning platform 214 to rotate on the pivot axis and have an angular displacement relative to fixed platform 202. Flexures 210 and 212 are not limited to torsional embodiments as shown in FIG. 2. For example, in some embodiments, flexures 210 and 212 take on other shapes such as arcs, "S" shapes, or other serpentine shapes. The term "flexure" as used herein refers to any flexible member coupling a scanning platform to another platform (scanning or fixed), and capable of movement that allows the scanning platform to have an angular displacement with respect to the other platform.

The particular MEMS device embodiment shown in FIG. 2 is provided as an example, and the various embodiments of the invention are not limited to this specific implementation. For example, any scanning mirror capable of providing mirror position information in one or both axes maybe incorporated without departing from the scope of the present invention.

Figure 3:
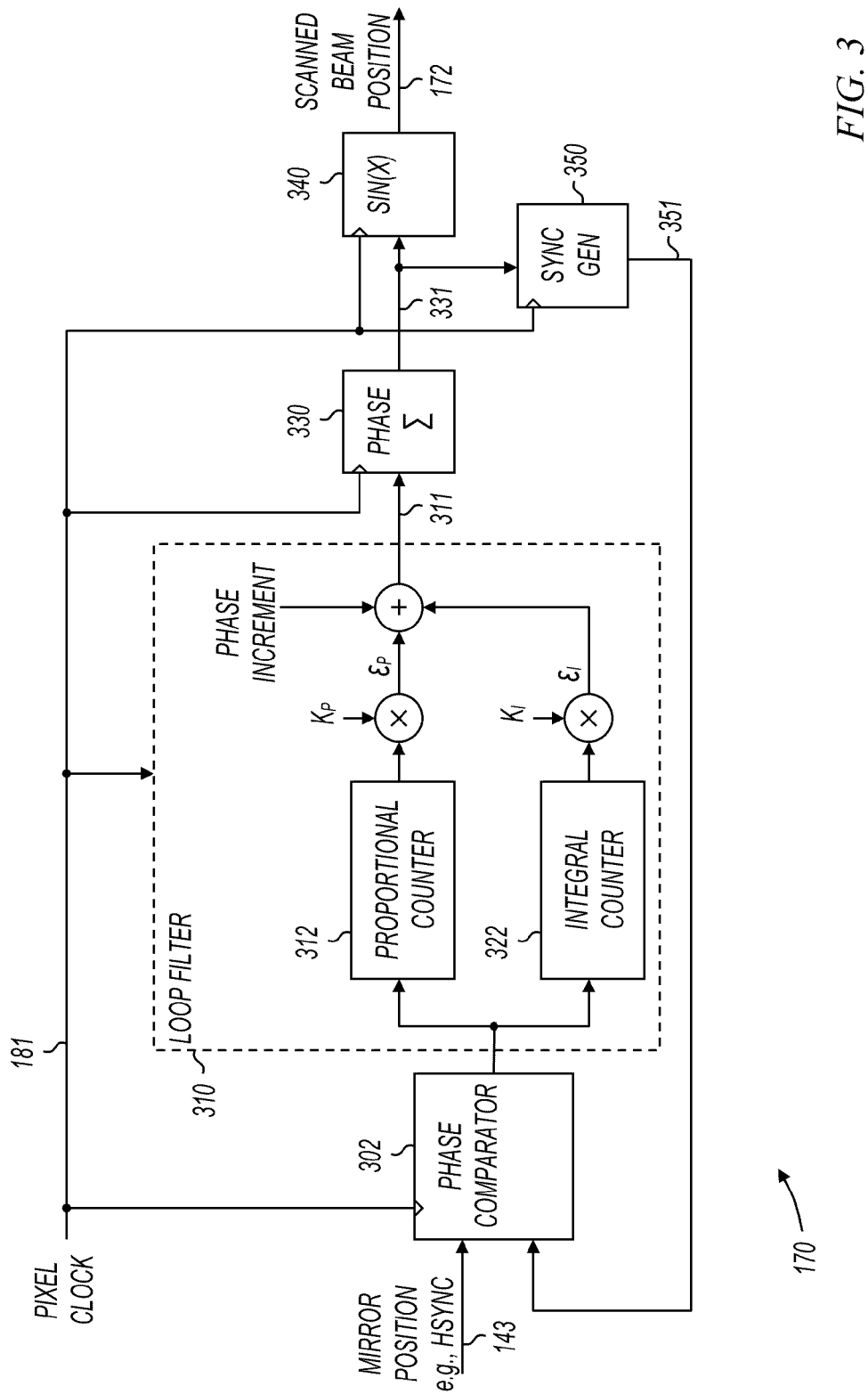
FIG. 3 shows a digital phase lock loop (PLL) circuit.

FIG. 3 shows a digital phase lock loop (PLL) circuit. PLL circuit 170 includes phase comparator 302, loop filter 310, phase accumulator 330, sine generator 340, and sync generator 350.

In operation, phase comparator 302 receives the mirror position at 143. The remainder of this description treats the mirror position signal as a sync signal, but this is not a limitation of the present invention. The mirror position signal may be any periodic signal that represents a sinusoidal mirror displacement.

Phase comparator 302 compares the sync signal at 143 with an internally generated sync signal at 351. Phase comparator 302 provides an error signal to loop filter 310. In some embodiments, phase comparator 302 provides a single digital signal (1 or 0) that represents the phase relationship between the two sync signals. In other embodiments, phase comparator 302 provides a multi-bit digital signal that represents the phase relationship (e.g., 1, 0, −1).

Loop filter 310 is shown including a proportional counter 312 and an integral counter 322. The output values of the counters are scaled by $K_P$ and $K_I$, and the resulting error terms $\epsilon_P$ and $\epsilon_I$ are summed with a static phase increment value to produce a phase value at 311. When the loop is locked, the phase value at 311 is substantially constant, but varies slightly to track the position of the mirror.

The phase values at 311 are summed by phase accumulator 330. Phase accumulator 330 sums the phase values and produces a phase signal at 331. The phase signal at 331 is a substantially linearly increasing phase value that represents the current position of the mirror. Sine generator 340 receives the phase signal at 331 and produces the sine of the phase signal at 172.

As shown in FIG. 3, in some embodiments, the sine of the phase signal at 331 is provided as the scanned beam position at 172. In other embodiments, the phase signal itself is provided as the scanned beam position. For example, in some embodiments, the output of phase accumulator 330 is provided as the scanned beam position information at 172.

In embodiments represented by FIG. 3, the phase signal at 331 is provided to sync generator 350 which produces an internally generated sync value at 351. The internally generated sync value is returned to the phase comparator 302, closing the loop, such that the phase signal at 331 and the regenerated digital sine wave at 172 is in phase lock to the mirror position.

All portions of digital PLL 170 operate at the pixel clock rate. Since digital phase comparator 302 outputs phase error information at a fixed clock rate, the phase error information provided to loop filter 310 will have an error of up to +/−0.5 of a clock tick. But because the loop bandwidth of this digital PLL can be set low relative to the high-frequency pixel clock, most of the phase comparator error noise is averaged out. Accordingly, the regenerated sine wave can maintain a phase lock to the incoming mirror position signal to a much finer resolution than the +/−0.5 clock tick.

Figure 4:
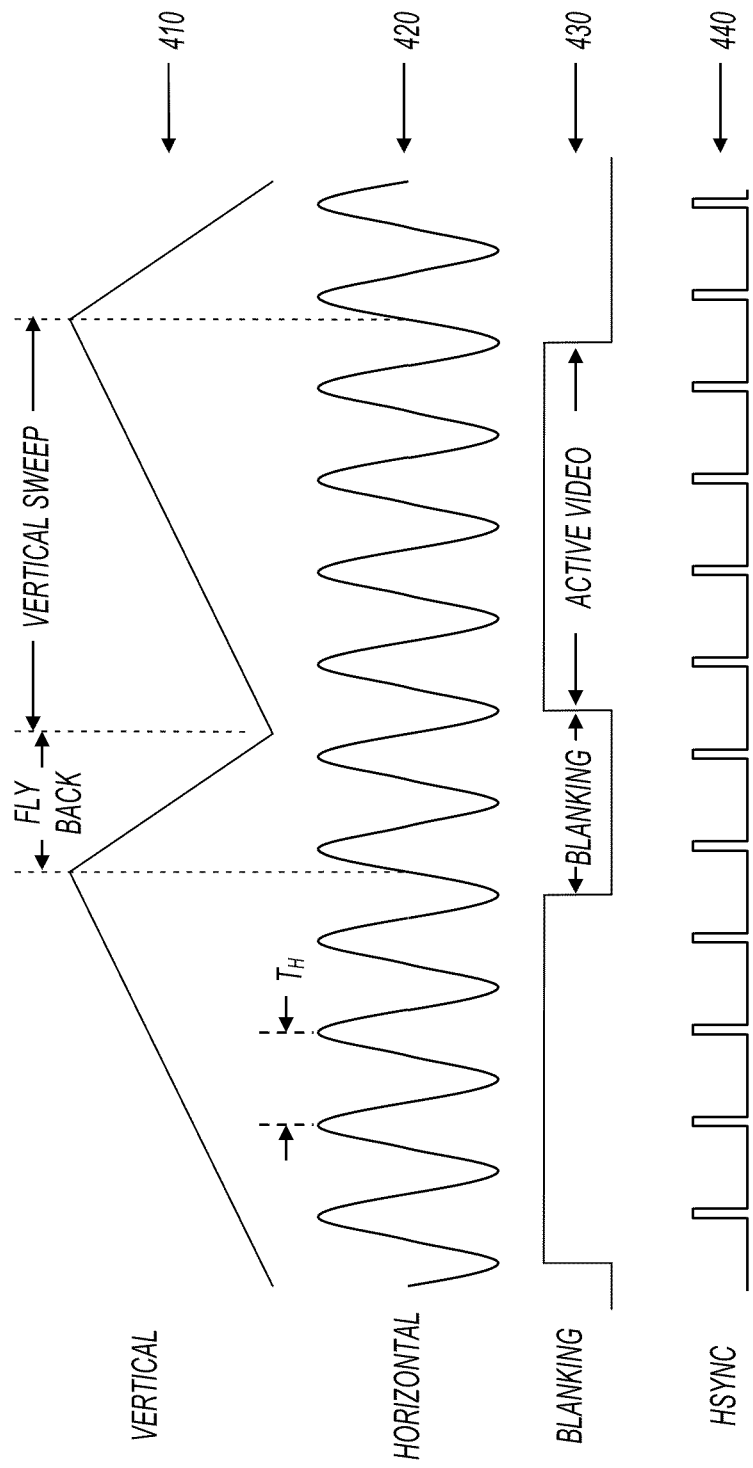
FIG. 4 shows example waveforms suitable for the operation of the projection system of FIG. 1.

FIG. 4 shows example waveforms suitable for the operation of the projection system of FIG. 1. Vertical deflection waveform 410 is a sawtooth waveform, and horizontal deflection waveform 420 is a sinusoidal waveform having period $T_H$. When mirror 142 is deflected on its vertical and horizontal axes according to the waveforms 410 and 420, the scanned beam trajectory shown in FIG. 5 results.

Deflection of mirror 142 according to waveforms 410 and 420 may be achieved by driving MEMS device 140 with the appropriate drive signals. In some embodiments, the horizontal deflection frequency is at a resonant frequency of the mirror and a very small excitation at that frequency will result in the desired deflection. A sawtooth drive signal for the vertical deflection may be derived from a sum of sine waves at various frequencies.

Sawtooth vertical deflection waveform 410 includes vertical sweep portions and flyback portions. In some embodiments, pixels are displayed during the vertical sweep portions, and not during the flyback portions. The flyback portions correspond to the beam "flying back" to the top of the image field of view. Blanking waveform 480 is also shown in FIG. 4. The scanned beam is blanked (no pixels are displayed) during flyback, and is not blanked during the vertical sweep.

Horizontal sync (HSYNC) signal 440 is also shown in FIG. 4. HSYNC signal 440 corresponds to the mirror position signal at 143 (FIG. 1). HSYNC is a digital signal that has one rising edge per period of the horizontal deflection waveform. HSYNC may be produced by passing the horizontal deflection waveform through a level detector. The horizontal deflection according to waveform 420 is measured by the position sensor(s) on the MEMS device 142, so HSYNC has the same period as the horizontal deflection, $T_H$.

Figure 5:
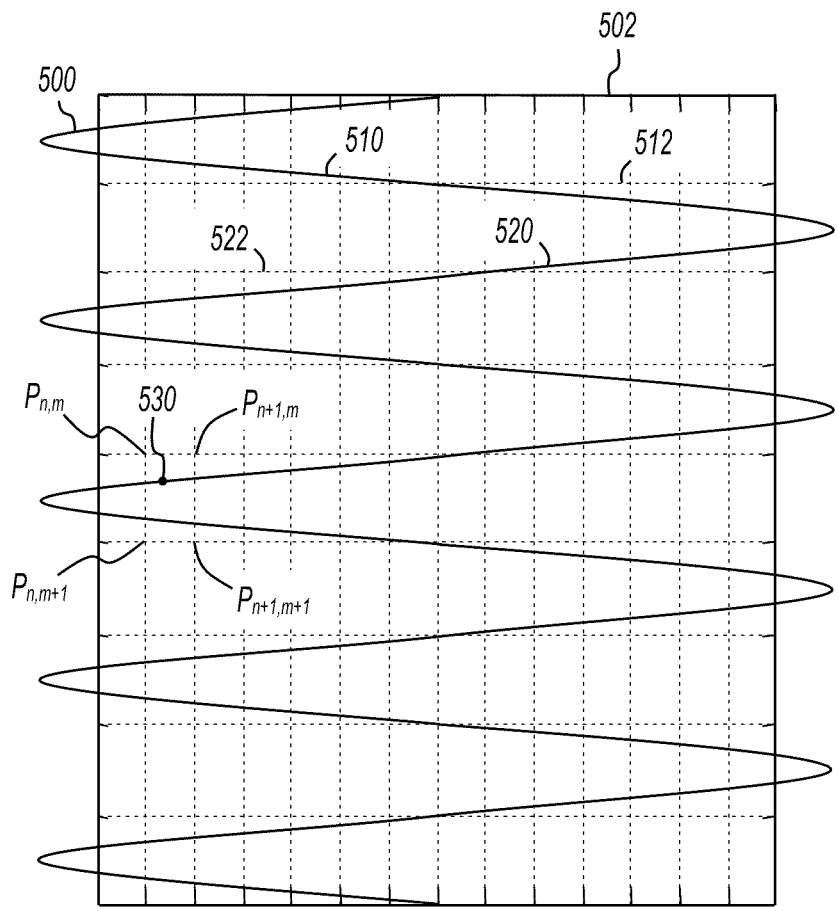
FIG. 5 shows a scan trajectory having a sinusoidal horizontal component and a linear vertical component.

FIG. 5 shows a scan trajectory having a sinusoidal horizontal component and a linear vertical component. Scan trajectory 500 corresponds to the vertical mirror deflection and horizontal mirror deflection shown in FIG. 4. Scan trajectory 500 is shown superimposed upon a grid 502. Grid 502 represents rows and columns of pixels that make up a display image. The rows of pixels are aligned with the horizontal dashed lines, and columns of pixels are aligned with the vertical dashed lines. The image is made up of pixels that occur at the intersections of dashed lines. Scan trajectory 500 has a sinusoidal horizontal component and a linear vertical component. On this trajectory, the beam sweeps back and forth left to right in a sinusoidal pattern, and sweeps vertically at a constant rate. In some embodiments, the trajectory sweeps up quickly during a "flyback" and pixels are not displayed on the retrace. In other embodiments (see FIG. 8), the trajectory sweeps up linearly at the same rate as it swept down, and pixels are display during both up and down vertical sweeps.

As described above with reference to FIG. 1, the projection system that produces scan trajectory 500 uses a free-running pixel clock. The free-running pixel clock results in displayed pixels that do not necessarily correspond in position to the pixels in grid 502. For example, a pixel clock edge may occur at point 530 which lies to the right of pixel $P_n$ and to the left of pixel $P_{n+1}$ in row m of grid 502. In some embodiments, the projection system may interpolate pixel intensity values in one dimension. For example, the projection system may interpolate pixel intensity values between $P_{n,m}$ and $P_{n+1,m}$, and display the resulting pixel intensity at point 530. In other embodiments, the projection system may interpolate pixel intensity values in two dimensions. For example, the projection system may interpolate pixel intensity values between $P_{n,m}$, $P_{n+1,m}$, $P_{n,m+1}$, and $P_{n+1,m+1}$, and display the resulting pixel intensity at point 530.

Displayed pixels may outnumber pixels in the grid. For example, because the horizontal sinusoidal trajectory sweeps faster in the center than at either the left or right sides, a linear pixel clock that displays at least one pixel per column near the horizontal center will display more than one pixel per column near the left and right sides. In some embodiments, the pixel clock and sweep frequencies are timed to display about two pixels per column in the center, and about eight or more pixels per column near the left and right sides. Further, because the free-running pixel clock is asynchronous with respect to the vertical and horizontal sweeps, pixels are not necessarily displayed at the same points during successive vertical and horizontal sweeps. Interpolation between neighboring pixels allows the pixel clock to "land" anywhere between pixels within the grid while still displaying the correct intensity.

In some embodiments, the vertical sweep rate is set such that the number of horizontal sweeps equals the number of rows in the grid. For example, as shown in FIG. 5, each horizontal sweep 510 from left to right may corresponds to one row 512 and the following sweep from right to left 520 may correspond to the next row 522. As described below with reference to FIG. 6, the vertical scan position at any time may be approximated as a corresponding row. This introduces some image distortion where the displayed pixels are clustered near the left and right sides of the image, but also reduces processing complexity. In other embodiments, the vertical sweep rate is independent of, and not related to, the number of rows in the grid.

Figure 6:
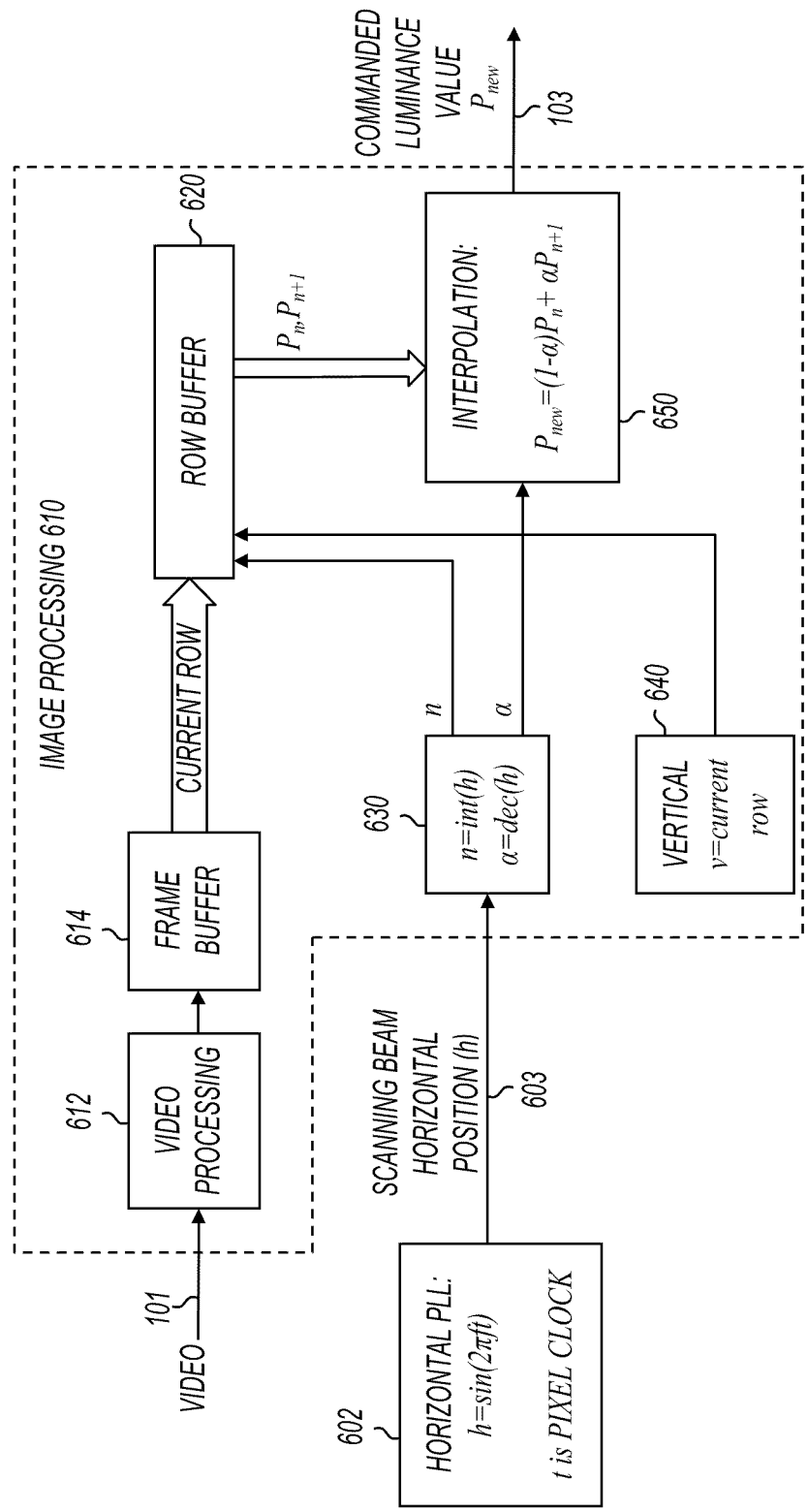
FIGS. 6 and 7 show image processing components that interpolate pixel data at times specified by a free-running pixel clock.

FIG. 6 shows an image processing component that interpolates pixel data at times specified by a free-running pixel clock. Image processing component 610 corresponds to component 102 (FIG. 1) in which the horizontal beam position is provided by a PLL and the vertical beam position is approximated as the current row. Image processing component 610 may be used to interpolate pixel intensity data in systems that have the scan trajectory of FIG. 5. Image processing device 610 includes video processing component 612, frame buffer 614, row buffer 620, and interpolation component 650. In some embodiments, there is at least one row buffer for each color, and in other embodiments, There are multiple row buffers for each color. For example, in some embodiments, there are three row buffers for each color.

In operation, video processing component 612 receives video at 101 and provides frames of image data to frame buffer 614. Rows of pixel data are loaded as needed from frame buffer 614 to row buffer 620, and then pixel intensity data is provided from row buffer 620 to interpolation component 650. Interpolation component 650 then interpolates the horizontal pixel intensity data based on the current scanning beam position.

The vertical scan position is approximated as the current row by component 640. In some embodiments, component 640 simply increments v each time the horizontal sweep reaches either the left or right side of the image. Row buffer 620 loads the current row from frame buffer 614 each time the vertical scan position v increments. In embodiments having a vertical retrace, v is incremented from zero to the total number of rows, and then restarts back at zero for the next vertical sweep from top to bottom. In embodiments having a bi-directional vertical sweep, v counts up in one vertical direction and counts down in the opposite vertical direction.

Horizontal PLL 602 determines the current horizontal scan position at each pixel clock as $$h = \sin(2\pi ft), \quad (1)$$

where t is evaluated at the pixel clock, and f is the horizontal sweep frequency. Horizontal PLL 602 corresponds to digital PLL 170 (FIGS. 1, 3).

As shown in equation (1), the horizontal scan position h is determined as the sine of the instantaneous phase value determined by the PLL. In some embodiments, the sine function is scaled, a phase offset may be included, and an offset may be added. For example, the horizontal scan position may be provided at each pixel clock as $$h = h_o \sin(2\pi ft + \Phi) + B. \quad (2)$$

where $h_o$ is a scale factor, $\Phi$ is a phase offset, and B is a linear offset. In some embodiments, $h_o$, $\Phi$, and B may be functions of other variables. For example, each may be different for each color channel (red, green, blue).

The horizontal beam position h is provided to image processing component 610 at 603 and is decomposed into the integer portion n and the decimal portion α at 630. The integer portion is used to retrieve the correct pixel data from row buffer 620, and the decimal portion is used in the interpolation of the pixel intensity data.

Row buffer 620 receives n and provides pixel intensity data for the $n^{th}$ pixel, $P_n$, and the pixel intensity data for the next pixel, $P_{n+1}$ to interpolation component 650. Interpolation component 650 interpolates between $P_n$ and $P_{n-1}$ to determine the new pixel intensity $P_{new}$ as $$P_{new} = (1-\alpha)P_n + \alpha P_{n+1} \quad (3)$$

Equation (3) provides interpolation between pixels in the same row (the current row), and the current row changes for each horizontal sweep. Referring now back to FIG. 5, a pixel clock edge occurs when the scan trajectory is at point 530. The intensity of the displayed pixel is calculated by equation (3) using $P_{n,m}$ and $P_{n+1,m}$ which are on the current row (the $m^{th}$ row).

In operation, row buffer 620 holds only one row (the current row) at a time because of the approximation that each horizontal sweep corresponds to one row. Prior to each horizontal sweep, row buffer 620 is loaded with one row of pixel data from frame buffer 614. The approximation saves power because multiple rows do not have to be accessed within frame buffer 614 to perform interpolation between rows.

Figure 7:
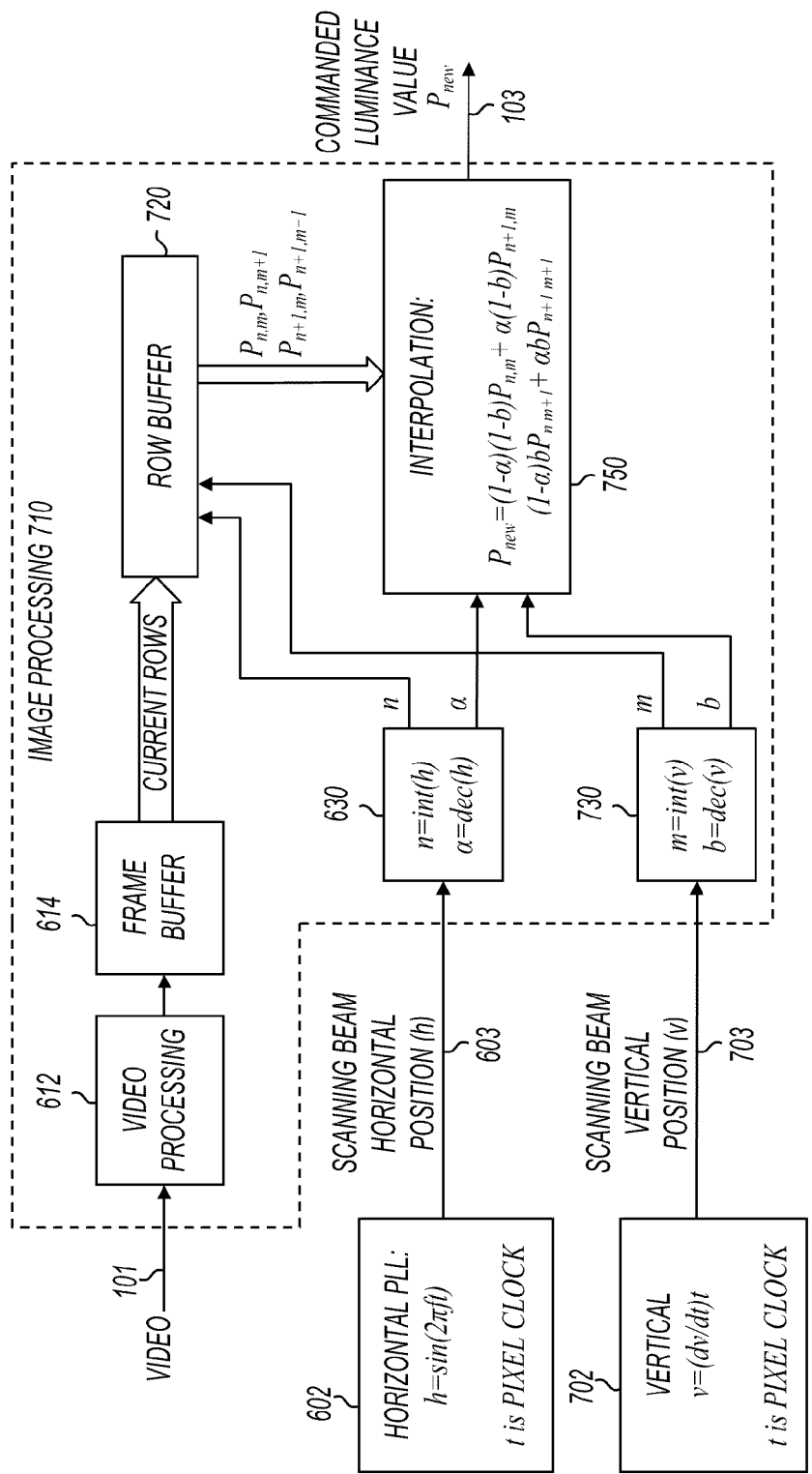

FIG. 7 shows another image processing component that interpolates pixel data at times specified by a free-running pixel clock. Image processing component 710 differs from image processing component 610 in that the vertical scan position is determined based on the linear trajectory rather than approximating the vertical scan position as the current row.

Component 710 includes video processing component 612, frame buffer 614, row buffer 720, and interpolation component 750. Video processing component 612 and frame buffer 614 and their operation are described above. Vertical scan position determination component 702 determines the vertical scan position v as $$v = \frac{dv}{dt}t. \quad (4)$$

where dv/dt is the vertical sweep speed and t is the time of the pixel clock edge. The vertical scan position is provided to image processing component 710 at 703.

The vertical scan position v is broken down into the integer portion m and the decimal portion b at 730. For example, if v is determined to be 9.7, (between the ninth and tenth rows), then m=9 and b=0.7. Row buffer 720 receives n and m and provides pixel intensity data for pixels, $P_{n,m}$, $P_{n,m+1}$, $P_{n+1,m}$, and $P_{n+1,m+1}$ to interpolation component 750. Interpolation component 750 interpolates between $P_{n,m}$, $P_{n,m+1}$, $P_{n+1,m}$ and $P_{n+1,m+1}$ to determine the new pixel intensity $P_{new}$ as $$P_{new} = (1-\alpha)(1-b)P_{n,m} + \alpha(1-b)P_{n+1,m} + (1-\alpha)bP_{n,m+1} + \alpha b P_{n+1,m+1} \quad (5)$$

Equation (5) is an example of linear interpolation between four pixels. The various embodiments of the invention are not limited to linear interpolation. For example, in some embodiments, nearest neighbor interpolation is used, and in other embodiments, higher order (e.g., cubic) interpolation is utilized.

An example of interpolation between four pixels is shown in FIG. 5. Equation (5) provides interpolation between pixels in different rows and different columns. In operation, row buffer 720 holds as many rows as necessary to accommodate one horizontal sweep. Further, vertical misalignment may be compensated by accessing one or more rows above or below the actual vertical scan position. In some embodiments, vertical color misalignment is compensated in this manner. Prior to each horizontal sweep, row buffer 720 is loaded with multiple rows of pixel data from frame buffer 614. Power is saved because random access within frame buffer 614 is not required.

Figure 8:
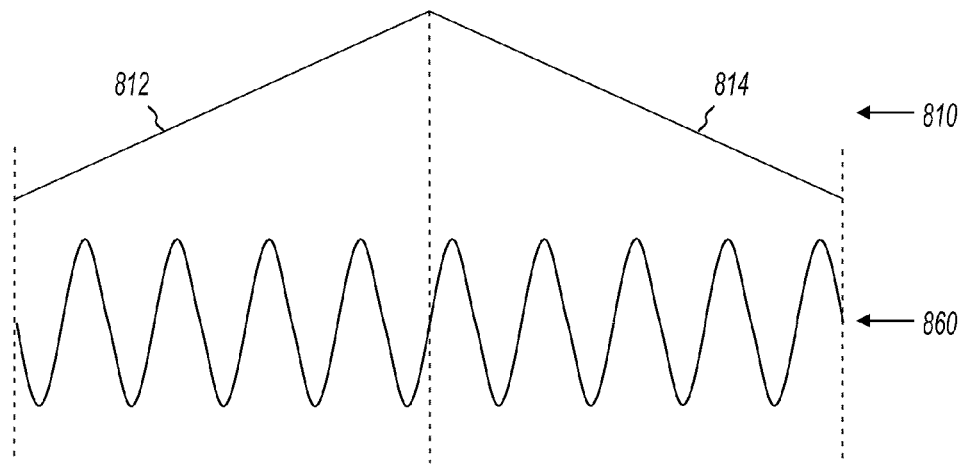
FIG. 8 shows deflection waveforms resulting from a linear vertical trajectory and a sinusoidal horizontal trajectory.

FIG. 8 shows deflection waveforms resulting from a linear vertical trajectory and a sinusoidal horizontal trajectory. Vertical deflection waveform 810 is a triangular waveform, and horizontal deflection waveform 860 is a sinusoidal waveform. In some embodiments, pixels are painted as the beam sweeps from top-to-bottom as well as from bottom-to-top. For example, during the rising portion 812 of the vertical triangular waveform, the beam sweeps trajectory 500 (FIG. 5) from top-to-bottom, and during falling portion 814, the beam sweeps trajectory 500 (or a different trajectory) from bottom-to-top.

The deflection waveforms shown in FIG. 8 correspond to operation of projection system 100 (FIG. 1) when the vertical deflection is a triangular and the horizontal deflection is sinusoidal. A horizontal PLL is used to track the position of the scanning mirror at each pixel clock as described above with reference to earlier figures. An interpolation component interpolates pixel data at times specified by the pixel clock.

Figure 9:
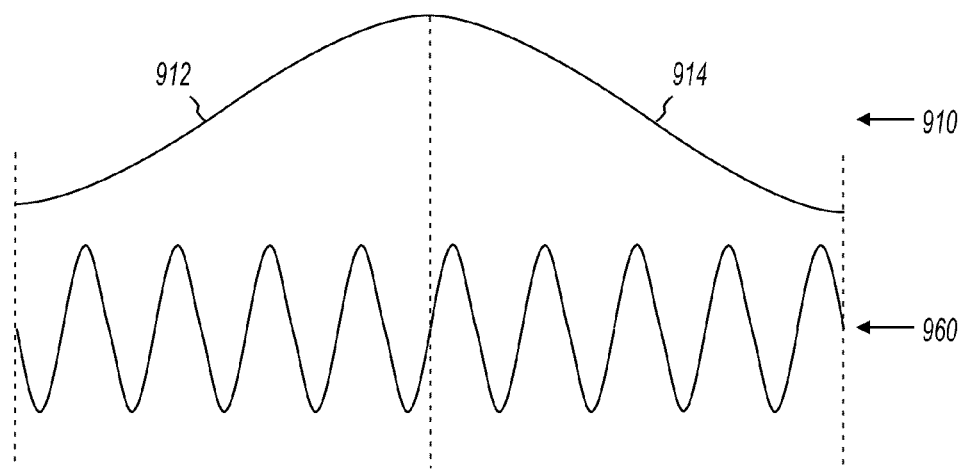
FIG. 9 shows deflection waveforms resulting from a sinusoidal vertical trajectory and a sinusoidal horizontal trajectory.

FIG. 9 shows deflection waveforms resulting from sinusoidal vertical trajectory and a sinusoidal horizontal trajectory. Both vertical deflection waveform 910 and horizontal deflection waveform 960 are sinusoidal waveforms. In some embodiments, pixels are painted as the beam sweeps from top-to-bottom as well as from bottom-to-top. In embodiments that utilize sinusoidal vertical and horizontal trajectories, two PLLs may be used; one to lock to the horizontal mirror position, and one to lock to the vertical position.

Figure 10:
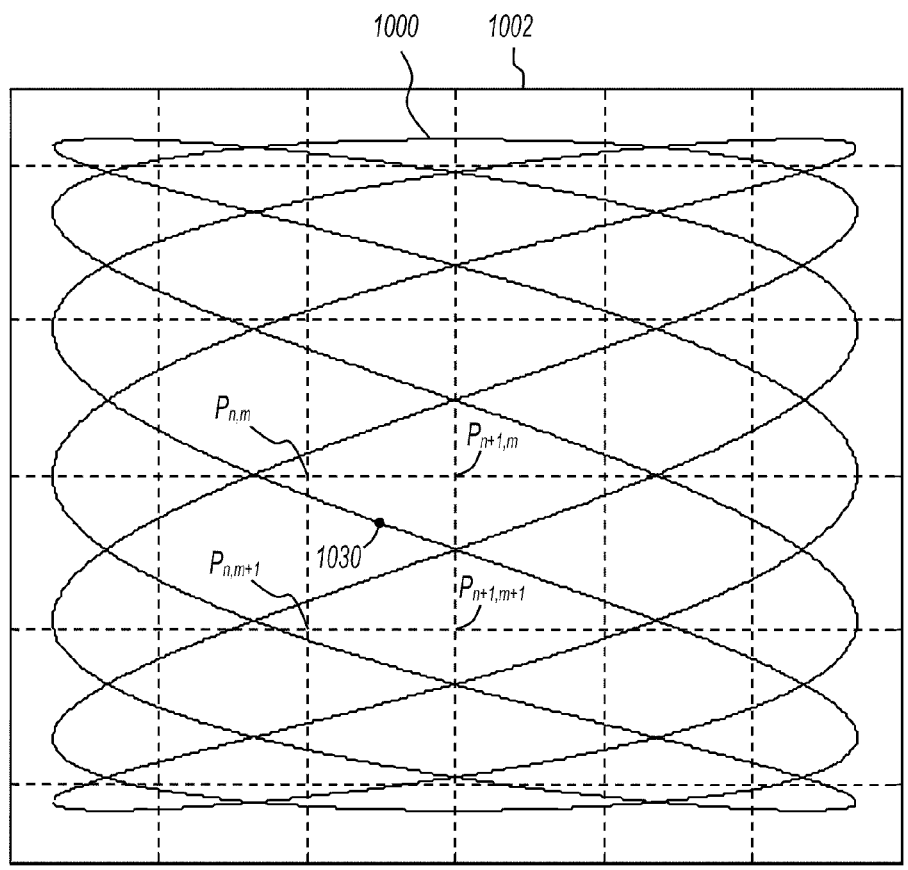
FIG. 10 shows a scan trajectory having a sinusoidal horizontal component and a sinusoidal vertical component.

FIG. 10 shows a scan trajectory having a sinusoidal horizontal component and a sinusoidal vertical component. The phase and frequency relationships between the horizontal and vertical trajectories are not the same as in FIG. 9. Any phase and frequency relationship can exist between the horizontal and vertical deflections without departing from the scope of the present invention. Scan trajectory 1000 is shown superimposed on grid 1002. Grid 1002 represents rows and columns of pixels that make up a display image. The rows of pixels are aligned with the horizontal dashed lines, and columns of pixels are aligned with the vertical dashed lines. Grid 1002 is shown having fewer pixels than grid 502 (FIG. 5), but this is not a limitation of the present invention. Any image resolution may be used with any scan trajectory. Scan trajectory 1000 corresponds to a beam that is swept sinusoidally and bi-directionally in both the horizontal and vertical dimensions. Displayed pixel 1030 corresponds to the scan position when one pixel clock arrives. The pixel intensity for displayed pixel 1030 is interpolated from the four surrounding pixels. Depending on the image resolution and the sweep rate, many displayed pixels may occur between image pixels.

Figure 11:
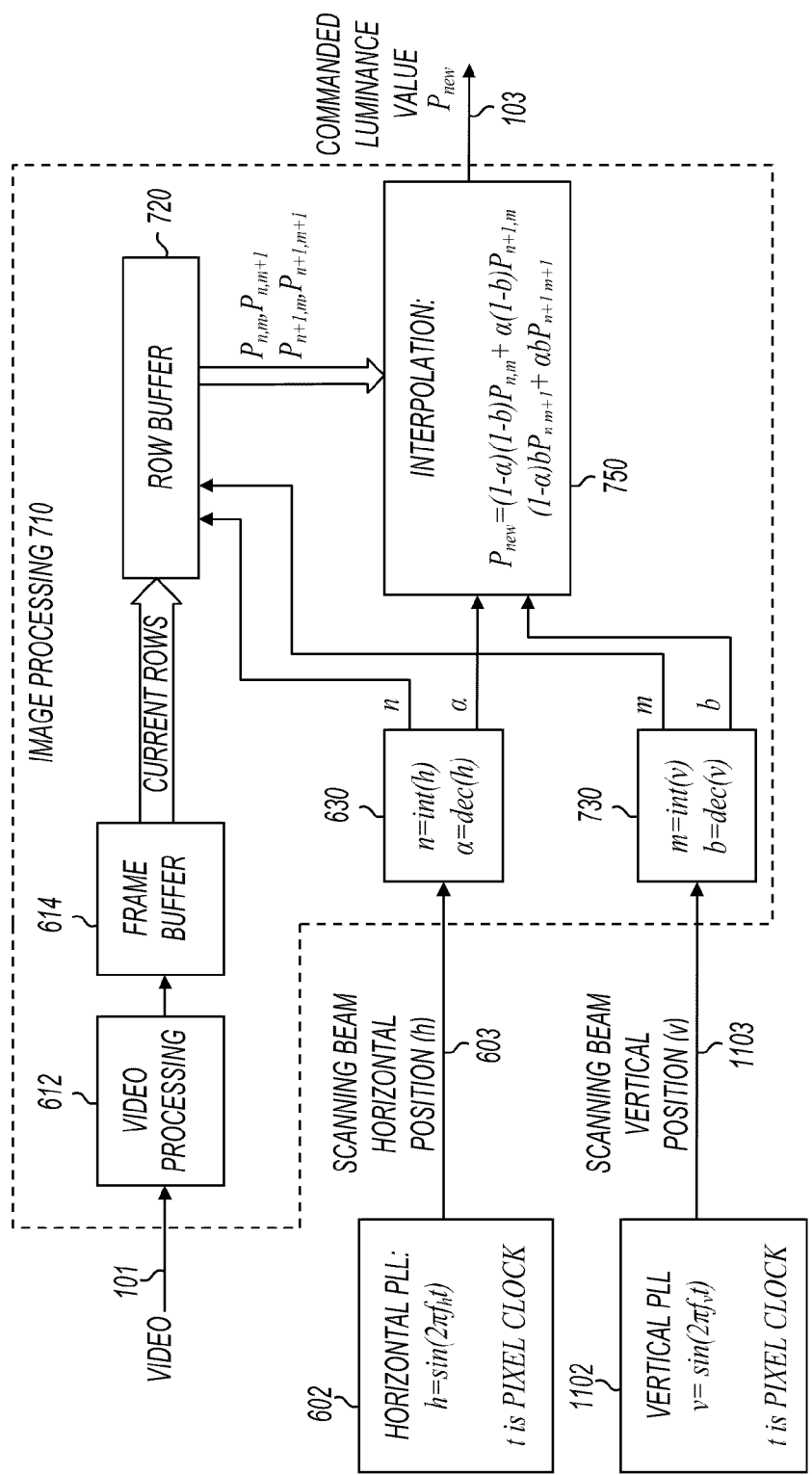
FIG. 11 shows an image processing component that interpolates pixel data for the scan trajectory of FIG. 10.

FIG. 11 shows an image processing component that interpolates pixel data for the scan trajectory of FIG. 10. Image processing component 710 is the same as that shown in FIG. 7. The difference is that the vertical scan position is supplied at 1103 by a PLL 1102 that is locked to the vertical sinusoidal deflection. In embodiments represented by FIG. 11, digital PLL(s) 170 (FIG. 1) includes two PLLs; one locked to the horizontal deflection, and one locked to the vertical deflection. Interpolation is performed in the same manner as that shown in equation (5), above.

Figure 12:
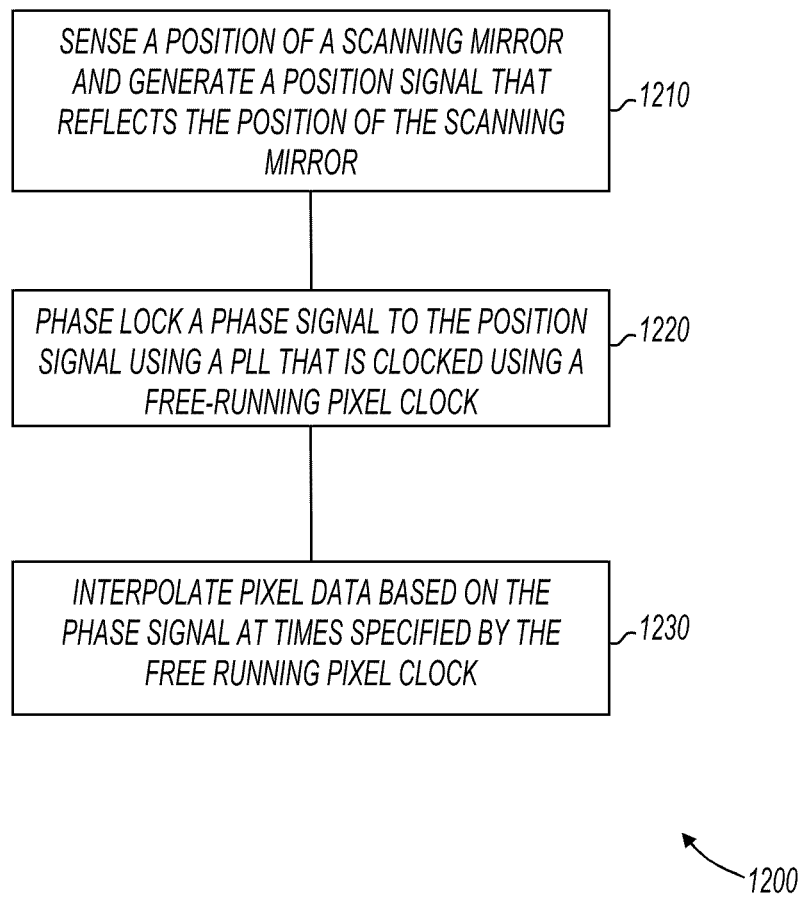
FIG. 12 shows a flowchart in accordance with various embodiments of the present invention.

FIG. 12 shows a flowchart in accordance with various embodiments of the present invention. In some embodiments, method 1200, or portions thereof, is performed by a raster scanning projector with a free-running pixel clock, or the like, embodiments of which are shown in previous figures. In other embodiments, method 1200 is performed by an integrated circuit or an electronic system. Method 1200 is not limited by the particular type of apparatus performing the method. The various actions in method 1200 may be performed in the order presented, or may be performed in a different order. Further, in some embodiments, some actions listed in FIG. 12 are omitted from method 1200.

Method 1200 is shown beginning with block 1210 in which a position of a scanning mirror is sensed and a position signal that reflects a position of a scanning mirror is generated. The position signal may be one or more sync signals that are synchronized to the mirror deflection. For example, a horizontal sync signal may be generated that signifies the position of the scanning mirror in the horizontal sweep. Also for example, a vertical sync signal may be generated that signifies the position of the scanning mirror in the vertical sweep.

The position signal is provided by a position sensor coupled to the scanning mirror. For example, referring back to FIG. 2, the position signal may be provided by a piezoresistive element that provides a voltage proportional to mirror deflection. A sync signal may then be produced by a threshold sensing circuit.

At 1220, a phase signal is phase locked to the position signal. This corresponds to the operation of PLL 170 (FIGS. 1, 3) which is clocked by the free-running pixel clock. For example, referring back to FIG. 3, the phase signal at 331 is phase locked to the position signal at 143.

At 1230, pixel data is interpolated at times specified by a free-running pixel clock. This corresponds to the operation of the various interpolation components described above. In some embodiments, pixel data is interpolated in one dimension, and in other embodiments, pixel data is interpolated in two dimensions.

Figure 13:
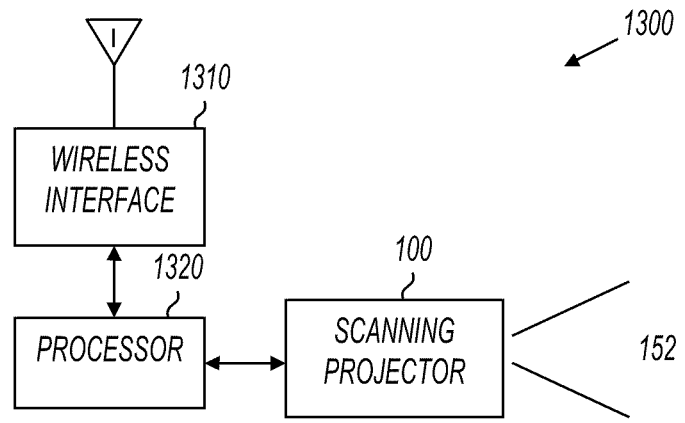
FIG. 13 shows a block diagram of a mobile device in accordance with various embodiments of the present invention.

FIG. 13 shows a block diagram of a mobile device in accordance with various embodiments of the present invention. As shown in FIG. 13, mobile device 1300 includes wireless interface 1310, processor 1320, and scanning projector 100. Scanning projector 100 paints a raster image at 152. Scanning projector 100 is described with reference to FIG. 1. In some embodiments, scanning projector 100 includes a free-running pixel clock and an interpolation component to interpolate pixel intensity data at times specified by the pixel clock.

Scanning projector 100 may receive image data from any image source. For example, in some embodiments, scanning projector 100 includes memory that holds still images. In other embodiments, scanning projector 100 includes memory that includes video images. In still further embodiments, scanning projector 100 displays imagery received from external sources such as connectors, wireless interface 1310, or the like.

Wireless interface 1310 may include any wireless transmission and/or reception capabilities. For example, in some embodiments, wireless interface 1310 includes a network interface card (NIC) capable of communicating over a wireless network. Also for example, in some embodiments, wireless interface 1310 may include cellular telephone capabilities. In still further embodiments, wireless interface 1310 may include a global positioning system (GPS) receiver. One skilled in the art will understand that wireless interface 1310 may include any type of wireless communications capability without departing from the scope of the present invention.

Processor 1320 may be any type of processor capable of communicating with the various components in mobile device 1300. For example, processor 1320 may be an embedded processor available from application specific integrated circuit (ASIC) vendors, or may be a commercially available microprocessor. In some embodiments, processor 1320 provides image or video data to scanning projector 100. The image or video data may be retrieved from wireless interface 1310 or may be derived from data retrieved from wireless interface 1310. For example, through processor 1320, scanning projector 100 may display images or video received directly from wireless interface 1310. Also for example, processor 1320 may provide overlays to add to images and/or video received from wireless interface 1310, or may alter stored imagery based on data received from wireless interface 1310 (e.g., modifying a map display in GPS embodiments in which wireless interface 1010 provides location coordinates).

Figure 14:
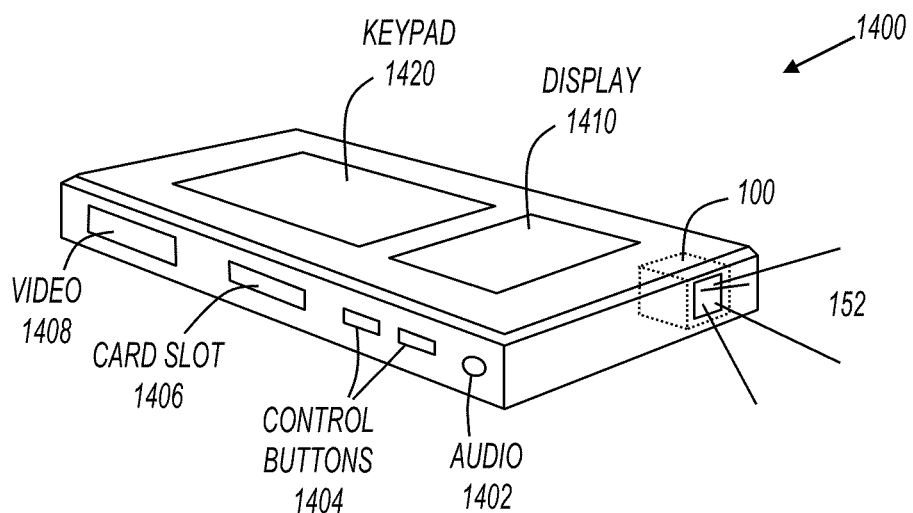
FIG. 14 shows a mobile device in accordance with various embodiments of the present invention.

FIG. 14 shows a mobile device in accordance with various embodiments of the present invention. Mobile device 1400 may be a hand held projection device with or without communications ability. For example, in some embodiments, mobile device 1400 may be a handheld projector with little or no other capabilities. Also for example, in some embodiments, mobile device 1400 may be a device usable for communications, including for example, a cellular phone, a smart phone, a personal digital assistant (PDA), a global positioning system (GPS) receiver, or the like. Further, mobile device 1400 may be connected to a larger network via a wireless (e.g., WiMax) or cellular connection, or this device can accept data messages or video content via an unregulated spectrum (e.g., WiFi) connection.

Mobile device 1400 includes scanning projector 100 to create an image with light at 152. Mobile device 1400 also includes many other types of circuitry; however, they are intentionally omitted from FIG. 14 for clarity.

Mobile device 1400 includes display 1410, keypad 1420, audio port 1402, control buttons 1404, card slot 1406, and audio/video (A/V) port 1408. None of these elements are essential. For example, mobile device 1400 may only include scanning projector 100 without any of display 1410, keypad 1420, audio port 1402, control buttons 1404, card slot 1406, or A/V port 1408. Some embodiments include a subset of these elements. For example, an accessory projector product may include scanning projector 100, control buttons 1404 and A/V port 1408.

Display 1410 may be any type of display. For example, in some embodiments, display 1410 includes a liquid crystal display (LCD) screen. Display 1410 may always display the same content projected at 152 or different content. For example, an accessory projector product may always display the same content, whereas a mobile phone embodiment may project one type of content at 152 while display different content on display 1410. Keypad 1420 may be a phone keypad or any other type of keypad.

A/V port 1408 accepts and/or transmits video and/or audio signals. For example, A/V port 1408 may be a digital port that accepts a cable suitable to carry digital audio and video data. Further, A/V port 1408 may include RCA jacks to accept composite inputs. Still further, A/V port 1408 may include a VGA connector to accept analog video signals. In some embodiments, mobile device 1400 may be tethered to an external signal source through A/V port 1408, and mobile device 1400 may project content accepted through A/V port 1408. In other embodiments, mobile device 1400 may be an originator of content, and A/V port 1408 is used to transmit content to a different device.

Audio port 1402 provides audio signals. For example, in some embodiments, mobile device 1400 is a media player that can store and play audio and video. In these embodiments, the video may be projected at 152 and the audio may be output at audio port 1402. In other embodiments, mobile device 1400 may be an accessory projector that receives audio and video at A/V port 1408. In these embodiments, mobile device 1400 may project the video content at 152, and output the audio content at audio port 1402.

Mobile device 1400 also includes card slot 1406. In some embodiments, a memory card inserted in card slot 1406 may provide a source for audio to be output at audio port 1402 and/or video data to be projected at 152. Card slot 1406 may receive any type of solid state memory device, including for example, Multimedia Memory Cards (MMCs), Memory Stick DUOs, secure digital (SD) memory cards, and Smart Media cards. The foregoing list is meant to be exemplary, and not exhaustive.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An apparatus comprising:
   a scanning mirror that moves in at least one dimension, the scanning mirror including at least one position sensor to sense a position of the scanning mirror and to provide a position signal;
   a loop circuit coupled to receive the position signal and to generate a phase signal locked to the position signal, the loop circuit being clocked by a pixel clock that is asynchronous with respect to vertical and horizontal sweeps of the scanning mirror;
   a free-running oscillator to generate the pixel clock that is asynchronous with respect to vertical and horizontal sweeps of the scanning mirror; and
   an interpolation component responsive to the pixel clock and the phase signal, the interpolation component to interpolate between pixels based on the phase signal at times specified by the pixel clock.

2. The apparatus of claim 1 wherein the scanning mirror moves sinusoidally in the at least one dimension.

3. The apparatus of claim 2 wherein the scanning mirror moves linearly in a second dimension.

4. The apparatus of claim 2 wherein the scanning mirror moves sinusoidally in a second dimension.

5. The apparatus of claim 1 wherein the scanning mirror moves in two dimensions, and the interpolation component interpolates between pixels in both dimensions.

6. The apparatus of claim 1 wherein the loop circuit includes a component to produce a sine of the phase signal, and the interpolation component is responsive to the sine of the phase signal.

7. The apparatus of claim 1 wherein the position signal is a horizontal sync signal.

8. The apparatus of claim 1 wherein the free-running oscillator comprises a crystal oscillator.

9. The apparatus of claim 1 wherein the scanning mirror moves in two dimensions, and the interpolation component interpolates between pixels in one of the two dimensions.

10. The apparatus of claim 1 further comprising a laser light source to produce laser light to reflect off the scanning mirror.

11. A mobile device comprising:
   at least one laser light source;
   a scanning mirror to reflect light from the at least one laser light source;
   a position sensor to detect a position of the scanning mirror and to produce a position signal;
   a phase locked loop circuit to produce a phase signal locked to the position signal, wherein the phase locked loop circuit is clocked by a pixel clock that is asynchronous with respect to vertical and horizontal sweeps of the scanning mirror;
   a free-running oscillator to provide the pixel clock that is asynchronous with respect to vertical and horizontal sweeps of the scanning mirror;
   a frame buffer to hold pixel data; and
   an interpolation component coupled to receive pixel data from the frame buffer, the interpolation component responsive to the phase signal to produce a commanded luminance at times specified by the pixel clock.

12. The mobile device of claim 11 wherein the mobile device comprises a cellular telephone.

13. The mobile device of claim 11 further comprising a video input port to receive an image from which the pixel data is determined.

14. The mobile device of claim 11 wherein the scanning mirror comprises a microelectromechanical system (MEMS) device.

15. The mobile device of claim 11 wherein the scanning mirror oscillates sinusoidally and the phase signal is a linearly increasing phase value that represents a current position of the scanning mirror.

16. The mobile device of claim 11 wherein the interpolation component interpolates pixel data in two dimensions.

17. A method of projecting an image using a raster scanning projector with a free-running pixel clock comprising:
   sensing a position of a scanning mirror and generating a position signal that reflects the position of the scanning mirror;
   generating the free-running pixel clock with a free-running oscillator such that the free-running pixel clock is asynchronous with respect to the position signal;
   phase locking a phase signal to the position signal using a phase locked loop that is clocked using the free-running pixel clock; and
   interpolating pixel data based on the phase signal at times specified by the free-running pixel clock.

18. The method of claim 17 wherein generating a position signal comprises generating a horizontal sync signal.

19. The method of claim 18 wherein phase locking a phase signal to the position signal comprises:
   creating a sync signal from the phase signal;
   comparing the sync signal and the position signal; and
   modifying a phase of the phase signal.

20. The method of claim 17 wherein interpolating comprises interpolating based on a sine of the phase signal.

* * * * *